United States Patent
Salot et al.

(10) Patent No.: US 7,235,112 B2
(45) Date of Patent: Jun. 26, 2007

(54) MICRO-BATTERY FABRICATION PROCESS INCLUDING FORMATION OF AN ELECTRODE ON A METAL STRIP, COLD COMPRESSION AND REMOVAL OF THE METAL STRIP

(75) Inventors: Raphaël Salot, Lans en Vercors (FR); Sébastien Martinet, Grenoble (FR); Jean Brun, Champagnier (FR); Gilles Poupon, Seyssinet-Pariset (FR)

(73) Assignee: Commissariat A L'Energie Atomique, Paris (FR)

( * ) Notice: Subject to any disclaimer, the term of this patent is extended or adjusted under 35 U.S.C. 154(b) by 324 days.

(21) Appl. No.: 10/250,903

(22) PCT Filed: Oct. 21, 2002

(86) PCT No.: PCT/FR02/03590

§ 371 (c)(1),
(2), (4) Date: Jul. 10, 2003

(87) PCT Pub. No.: WO03/036750

PCT Pub. Date: May 1, 2003

(65) Prior Publication Data

US 2004/0049909 A1 Mar. 18, 2004

(30) Foreign Application Priority Data

Oct. 22, 2001 (FR) .................................. 01 13570

(51) Int. Cl.
*H01M 4/82* (2006.01)
*B05D 1/28* (2006.01)
*B23K 31/02* (2006.01)

(52) U.S. Cl. ............... 29/623.1; 29/623.3; 427/428.18; 427/369; 228/901; 228/120

(58) Field of Classification Search ............... 29/623.5, 29/623.2, 623.1, 623.4; 429/124; 427/255.11, 427/255.15, 255.7, 314, 419.1, 428.02, 428.18, 427/966.1, 96.8, 97.1, 369, 372.2; 428/548, 428/101, 102; 228/901, 904, 120, 179.1
See application file for complete search history.

(56) References Cited

U.S. PATENT DOCUMENTS

| | | | | |
|---|---|---|---|---|
| 3,556,861 A | * | 1/1971 | Jammet | .................. 29/623.1 |
| 5,582,623 A | * | 12/1996 | Chu | .................. 29/623.1 |
| 5,877,547 A | * | 3/1999 | Rhelimi | .................. 257/679 |
| 6,402,796 B1 | * | 6/2002 | Johnson | .................. 29/623.5 |
| 6,576,369 B1 | * | 6/2003 | Moriguchi et al. | ....... 429/231.8 |
| 6,610,440 B1 | * | 8/2003 | LaFollette et al. | .......... 429/122 |

* cited by examiner

*Primary Examiner*—Raymond Alejandro
(74) *Attorney, Agent, or Firm*—Oliff & Berridge PLC

(57) ABSTRACT

The electrodes are formed by surface coating and cold compression on metal strips. They are then assembled, by hot pressing, with an electrolytic membrane. The metal strips are then removed, preferably by mechanical detachment. Current collectors are then formed on each of the electrodes by PVD type techniques that are conventional in microelectronics. The resulting thin micro-battery with high surface capacity can then be integrated in an integrated circuit, in particular by bonding by means of indium connecting balls.

12 Claims, 2 Drawing Sheets

MICRO-BATTERY FABRICATION PROCESS INCLUDING FORMATION OF AN ELECTRODE ON A METAL STRIP, COLD COMPRESSION AND REMOVAL OF THE METAL STRIP

BACKGROUND OF THE INVENTION

The invention relates to a fabrication process of a micro-battery comprising an electrolytic membrane arranged between first and second electrodes and current collectors arranged on each side of the first and second electrodes.

STATE OF THE ART

A lithium micro-battery, in the form of thin films, the thickness whereof is comprised between 7 µm and 30 µm (preferably about 15 µm), is conventionally formed by means of the chemical vapor deposition (CVD) or physical vapor deposition (PVD) techniques. A micro-battery of this type is for example described in the document WO-A-9,848,467.

The operating principles of a micro-battery are based on insertion and de-insertion of an alkaline metal ion or a proton in the positive electrode of the micro-battery, preferably a lithium ion $Li^+$ originating from a metallic lithium electrode. The micro-battery is formed by a stack of layers obtained by CVD or PVD, respectively constituting two current collectors, a positive electrode, an electrolyte, a negative electrode and, possibly, an encapsulation.

The elements of the micro-battery can be made from various materials:
- The metal current collectors 3a and 3b can for example be platinum (Pt), chromium (Cr), gold (Au) or titanium (Ti) based.
- The positive electrode can be formed by $LiCoO_2$, $LiNiO_2$, $LiMn_2O_4$, CuS, $CuS_2$, $WO_yS_z$, $TiO_yS_z$, $V_2O_5$ or $V_3O_8$ and lithium forms of these vanadium oxides and metal sulfides.
- The electrolyte, which is a good ion conductor and electric insulator, can be formed by a vitreous material with a boron oxide, lithium oxides or lithium salt base.
- The negative electrode can be formed by metallic lithium deposited by thermal evaporation, by a lithium-based metal alloy or by an insertion compound of the SiTON, $SnN_x$, $InN_x$, $SnO_2$, etc. type.
- The object of the possible encapsulation is to protect the active stacking from the external environment and, more specifically, from humidity. It can be formed by ceramic, by a polymer (hexamethyldisiloxane, parylene, epoxy resins), by a metal or by superposition of layers of these different materials.

U.S. Pat. No. 5,582,623 describes formation of a positive electrode of a lithium battery from a paste that is deposited on a substrate so as to form a thin film.

The substrate is:
- either a metallic current collector,
- or a non-adhesive substrate, for example made of Teflon®, and the electrode is then separated from the substrate after drying before being fixed to a current collector.

Depending on the materials used, the operating voltage of a micro-battery is comprised between 2V and 4V, with a surface capacity of about 100 µAh/cm². Recharging of a micro-battery only requires a few minutes of charging. The fabrication techniques used enable all the required shapes and surfaces to be obtained.

The capacity of a micro-battery can in principle be increased by increasing the thickness of the electrodes or by superposition of parallel-connected micro-batteries. These modifications are however delicate to implement. It is in fact difficult to obtain layers with a thickness of more than 10 µm by vapor deposition while preserving its initial properties. Moreover, the changes in volume caused in the different layers by diffusion of the lithium create large problems of stresses in the case of a stack of micro-batteries.

Furthermore, mini-batteries currently available on the market and fabricated using coating techniques have a thickness comprised between 300 µm and 650 µm with a surface capacity of about a few mAh/cm², i.e. much greater than that of a micro-battery. The too large thickness of current mini-batteries does not enable them to be positioned on an integrated circuit, in particular in the case of a smart card having a maximum thickness of less than 0.76 mm.

OBJECT OF THE INVENTION

The object of the invention is to increase the surface capacity of an energy source able to be placed on an integrated circuit.

According to the invention, this objective is achieved by the fact that the first electrode is formed on a first metal strip by surface coating, then cold compression, the first metal strip being removed before the current collectors are formed.

According to a first development of the invention, the second electrode is formed on a second metal strip by surface coating, then cold compression, the second metal strip being removed before the current collectors are formed.

According to a second development of the invention, the second electrode is formed by surface coating on the electrolytic membrane.

The electrodes and the electrolytic membrane are assembled by hot pressing before the metal strip or strips are removed.

According to another feature of the invention, the current collectors are formed by thin films formed on the electrodes by physical vapor deposition.

BRIEF DESCRIPTION OF THE DRAWINGS

Other advantages and features will become more clearly apparent from the following description of particular embodiments of the invention given as non-restrictive examples only and represented in the accompanying drawings in which.

DESCRIPTION OF PARTICULAR EMBODIMENTS

Figure 1:
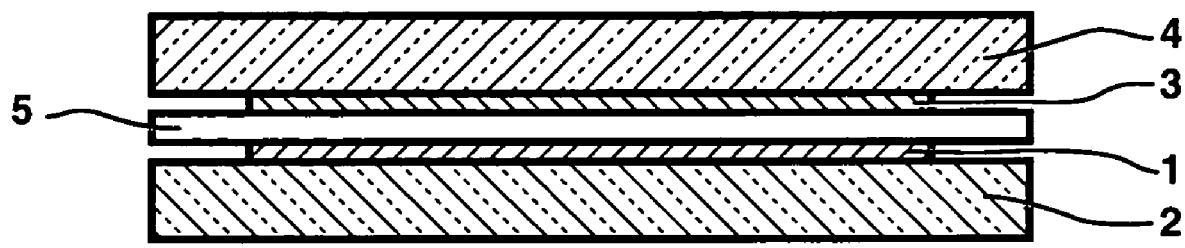
FIGS. 1 to 5 illustrate the successive stages of a particular embodiment of a fabrication process according to the invention.

In a first step, a negative electrode 1 is prepared. An ink is for example formed by a mixture of the following four constituents:
- SPG6™ graphite and mesocarbon balls, which constitute the active material responsible for inserting the lithium,
- PVDF polymer, which has the function of providing the mechanical cohesion of the electrode,
- carbon black, which improves the electronic conductivity of the electrode.

The ink thus formed is applied on a first metal strip 2, made of copper, and compressed under 2 tonnes/cm². Cold compression in one or more steps enables the required thickness to be obtained for the electrode 1 and enables it to be made to adhere to the metal strip 2 which acts as mechanical support therefor.

In a second step, a positive electrode 3 is prepared in the form of an ink made up from manganese oxide ($LiMn_2O_4$), PVDF and carbon black, coated on a second metal strip 4, made of aluminum, and compressed under 2 tonnes/cm².

In a third step, an electrolytic membrane 5 made of PVDF/HFP copolymer is prepared. The membrane 5 is an electrically insulating and ionically conducting membrane after activation. It is formed by a phase inversion process, which enables a membrane having a controlled microporosity to be obtained. This process comprises the following three steps:
  surface application on a glass support of a binary or ternary mixture comprising the copolymer, a solvent (which creates the porosity in the polymer before being removed) and, possibly, a non-solvent;
  removal of the solvent by immersion in a non-solvent phase or selective drying;
  final drying of the membrane.

In a fourth step, the electrodes 1 and 3, respectively supported by the metal strips 2 and 4, and the membrane 5 are assembled. The membrane 5 is arranged between the electrodes placed facing one another. The positive electrode/ membrane/negative electrode assembly is bonded by hot pressing (0.5 tonnes/cm², 120° C.) with a thickness control enabling a thickness of 50 µm to 100 µm to be obtained for the assembly as represented in FIG. 1.

Figure 2:
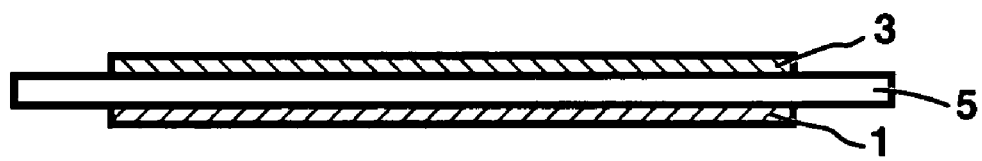

In a fifth step, the metal strips 2 and 4 are removed, preferably by mechanical detachment. The assembly obtained after removal of the metal strips 2 and 4 is represented in FIG. 2. The surface coating and pressing conditions of the previous steps are optimized to facilitate mechanical detachment of the metal strips during the fifth step.

Figure 3:
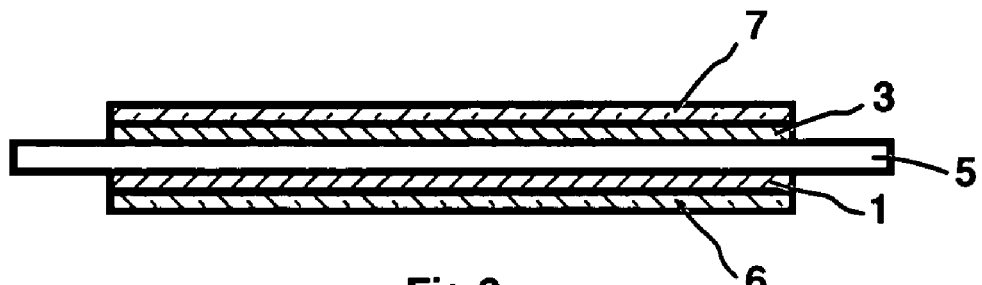

In a sixth step illustrated in FIG. 3, current collectors designed to act as connection terminals are formed on the electrodes in the form of thin films obtained by physical vapor deposition. A first current collector 6, formed by a copper layer with a thickness of 0.2 µm, is deposited on the negative electrode 1. A second current collector 7, formed by a layer of aluminum, with a thickness of 0.2 µm, is then deposited on the positive electrode 3.

Figure 4:
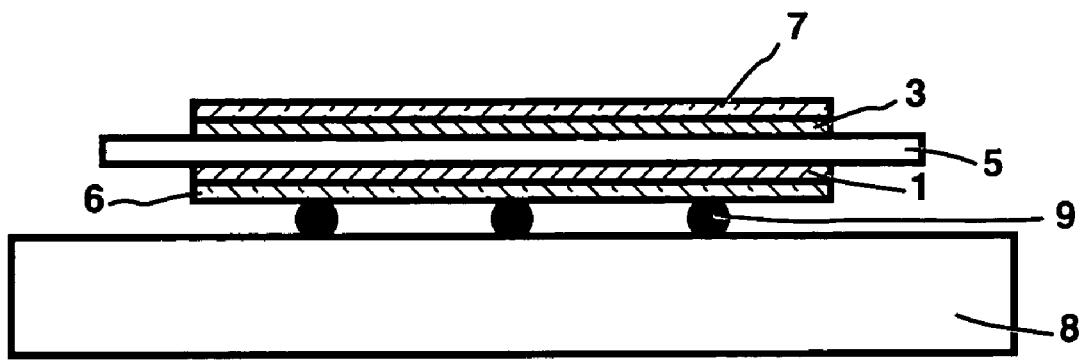

In a seventh step illustrated in FIG. 4, the micro-battery is integrated on an integrated circuit 8. This can be achieved by any suitable technique known in microelectronics (flip chip, bonding, direct or anode sealing). This integration is preferably achieved by bonding by means of connecting balls 9 made of a material that melts at low temperature, designed to perform both mechanical connection between the micro-battery and the integrated circuit and electrical connection between one of the current collectors (6 in FIG. 4) and the integrated circuit. The connecting balls 9 are preferably made of indium, a material having a melting temperature (157° C.) compatible with the materials of the micro-battery.

Figure 5:
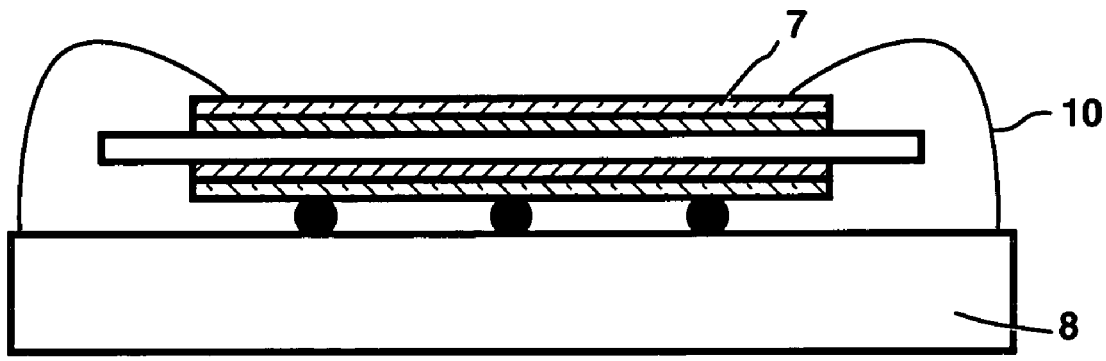

In an eighth step illustrated in FIG. 5, the current collector 7, which is not electrically connected to the integrated circuit 8 by the connecting balls 9, is connected to the integrated circuit by at least one wire 10, soldered at one end onto the current collector 7 and at the other end onto the integrated circuit 8.

In a last step, the micro-battery is activated by filling, in a vacuum, by an electrolyte formed by a lithium salt. The micro-battery can then be encapsulated, for example by means of a silicon protective cap.

The fabrication process described above thus uses, in part, similar techniques to those that are conventionally used for fabricating mini-batteries (surface coating of the layers of the active stacking formed by the electrodes and electrolytic membrane). However, detachment of the metal strips enables the thickness of this stacking to be reduced as far as possible, which stacking is then completed by deposition of the current collectors by techniques of the PVD type, that are standard practice in microelectronics.

This makes it possible to fabricate for example a micro-battery with a surface of 25 mm² and a thickness of 50 µm with a surface capacity of about 500 µAh/cm² (i.e. 125 µAh), that is to say five times greater than the surface capacity of current micro-batteries. This micro-battery can be arranged on an integrated circuit that performs management of its charging and discharging. The micro-battery obtained thus combines the advantages of mini-batteries (high surface capacity in particular) and the advantages of micro-batteries (able to be integrated on an integrated circuit). A micro-battery of this type can, in particular, be used to improve the safety of smart cards and also in smart labels.

Figure 6:
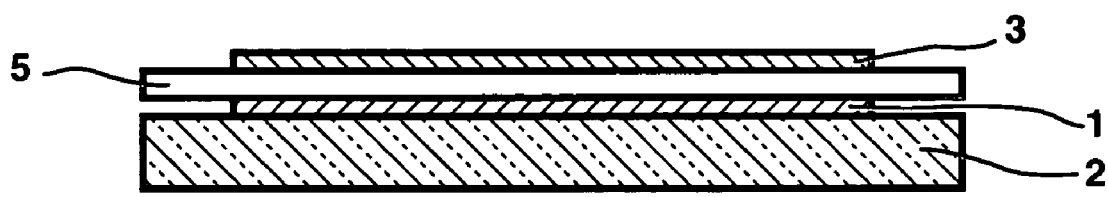
FIG. 6 illustrates an alternative embodiment of the first stages of the process according to the invention.

In an alternative embodiment, illustrated in FIG. 6, a single metal strip is used. As previously, one of the electrodes; for example the negative electrode 1, is formed on the metal strip 2. The electrolytic membrane 5 is then deposited on the negative electrode 1 and the other electrode (positive electrode 3) is formed by coating directly on the electrolytic membrane 5. After hot pressing of the assembly, the metal strip 2 is removed. The assembly thus formed is similar to the one represented in FIG. 2 and the subsequent fabrication steps are unchanged.

The invention claimed is:

1. A fabrication process of a thin film battery, comprising:
  forming a first electrode on a first metal strip by surface coating, followed by cold compression of the first electrode and the first metal strip;
  forming a second electrode on a second metal strip by surface coating, followed by cold compression of the first electrode and the first metal strip;
  arranging an electrolytic membrane between the first and second electrodes by hot pressing;
  removing the first and second metal strips; and
  forming a current collector on a surface of each of the first and second electrodes, the surface the current collector is formed on is facing in a direction opposite of the surface of the electrode facing the electrolytic membrane.

2. The process according to claim 1, wherein removal of the metal strips is achieved by mechanical detachment.

3. The process according to claim 1, wherein the current collectors are formed on the electrodes by physical vapor deposition and comprise thin films.

4. The process according to claim 1, wherein the thin film battery is bonded onto an integrated circuit by connecting balls made of a material that melts at a low temperature, and configured to perform both mechanical connection between the thin film battery and the integrated circuit and electrical connection between one of the current collectors and the integrated circuit.

5. The process according to claim 4, wherein the connecting balls are made of indium.

6. The process according to claim 4, wherein the current collector, which is not connected to the connecting balls, is electrically connected to the integrated circuit by at least one wire.

7. A fabrication process of a thin film battery, comprising:
forming a first electrode on a first metal strip by surface coating, followed by cold compression of the first electrode and the first metal strip;
forming an electrolytic membrane on the first electrode by deposition;
forming a second electrode on the electrolytic membrane by surface coating, wherein an electrodes/membrane assembly is formed comprising a first electrode, an electrolytic membrane, and a second electrode;
hot pressing the electrodes/membrane assembly; removing the metal strip; and
forming a current collector on a surface of each of the first and second electrodes, the surface the current collector being formed on is facing in a direction opposite of the surface facing the electrolytic membrane.

8. The process according to claim 7, wherein removal of the metal strip is achieved by mechanical detachment.

9. The process according to claim 7, wherein the current collectors are formed on the electrodes by physical vapor deposition and comprise thin films.

10. The process according to claim 7, wherein the thin film battery is bonded onto an integrated circuit by connecting balls made of a material that melts at a low temperature, configured to perform both mechanical connection between the thin film battery and the integrated circuit and electrical connection between one of the current collectors and the integrated circuit.

11. The process according to claim 10, wherein the connecting balls are made of indium.

12. The process according to claim 10, wherein the current collector, which is not connected to the connecting balls, is electrically connected to the integrated circuit by at least one wire.

* * * * *

UNITED STATES PATENT AND TRADEMARK OFFICE
CERTIFICATE OF CORRECTION

PATENT NO.       : 7,235,112 B2
APPLICATION NO.  : 10/250903
DATED            : June 26, 2007
INVENTOR(S)      : Raphaël Salot et al.

It is certified that error appears in the above-identified patent and that said Letters Patent is hereby corrected as shown below:

Col. 4, line 35, claim 1, should read:

1. A fabrication process of a thin film battery, comprising:
    forming a first electrode on a first metal strip by surface coating, followed by cold compression of the first electrode and the first metal strip;
    forming a second electrode on a second metal strip by surface coating, followed by cold compression of the [[first]] second electrode and the [[first]] second metal strip;
    arranging an electrolytic membrane between the first and second electrodes by hot pressing;
    removing the first and second metal strips; and
    forming a current collector on a surface of each of the first and second electrodes, the surface the current collector is formed on is facing in a direction opposite of the surface of the electrode facing the electrolytic membrane.

Signed and Sealed this
Twelfth Day of April, 2011

David J. Kappos
*Director of the United States Patent and Trademark Office*